United States Patent
Fujitsuka et al.

(10) Patent No.: US 8,008,152 B2
(45) Date of Patent: Aug. 30, 2011

(54) METHOD OF MANUFACTURING SEMICONDUCTOR DEVICE

(75) Inventors: Ryota Fujitsuka, Yokohama (JP);
Katsuaki Natori, Yokohama (JP);
Daisuke Nishida, Yokohama (JP);
Masayuki Tanaka, Yokohama (JP);
Katsuyuki Sekine, Yokohama (JP);
Yoshio Ozawa, Yokohama (JP); Akihito Yamamoto, Naka-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 447 days.

(21) Appl. No.: 11/727,981

(22) Filed: Mar. 29, 2007

(65) Prior Publication Data

US 2008/0014745 A1    Jan. 17, 2008

(30) Foreign Application Priority Data

Apr. 14, 2006  (JP) .................... 2006-112193

(51) Int. Cl.
*H01L 21/00* (2006.01)
(52) U.S. Cl. ............... 438/261; 438/785; 257/E21.179
(58) Field of Classification Search .......... 438/257–267, 438/758–763, 785; 257/E21.179
See application file for complete search history.

(56) References Cited

U.S. PATENT DOCUMENTS

| | | | | |
|---|---|---|---|---|
| 3,396,052 A | * | 8/1968 | Rand ............................ | 438/778 |
| T954,009 I4 | * | 1/1977 | Malin et al. .................. | 438/774 |
| 5,382,550 A | * | 1/1995 | Iyer ............................... | 438/784 |
| 6,020,238 A | * | 2/2000 | He et al. ...................... | 438/261 |
| 6,326,260 B1 | * | 12/2001 | Divakaruni et al. ......... | 438/241 |
| 6,403,423 B1 | * | 6/2002 | Weybright et al. .......... | 438/279 |
| 6,413,820 B2 | * | 7/2002 | Bui .............................. | 438/257 |
| 6,429,088 B1 | * | 8/2002 | Lau ............................. | 438/393 |
| 6,897,149 B2 | | 5/2005 | Sugawara et al. | |
| 2006/0060927 A1 | | 3/2006 | Ozawa et al. | |

FOREIGN PATENT DOCUMENTS

| | | |
|---|---|---|
| JP | 5-129625 | 5/1993 |
| JP | 2001-085424 | 3/2001 |
| JP | 2003-007861 | 1/2003 |
| JP | 2003-68897 | 3/2003 |
| JP | 2003-168749 | 6/2003 |
| JP | 2005-026590 | 1/2005 |
| JP | 2007-184523 | 7/2007 |

OTHER PUBLICATIONS

Notice of Reasons for Rejection, issued by Japanese Patent Office, mailed on Feb. 8, 2011, in a counterpart Japanese application No. 2006-112193, 2 pages.

* cited by examiner

*Primary Examiner* — Richard A. Booth
(74) *Attorney, Agent, or Firm* — Finnegan, Henderson, Farabow, Garrett & Dunner, L.L.P.

(57) ABSTRACT

A method of manufacturing a semiconductor device comprising a first insulating film formed on a semiconductor substrate, a charge storage layer formed on the first insulating film, a second insulating film formed on the charge storage layer, and a control electrode formed on the second insulating film, forming the second insulating film comprises forming a lower insulating film containing oxygen and a metal element, thermally treating the lower insulating film in an atmosphere containing oxidizing gas, and forming an upper insulating film on the thermally treated lower insulating film using film forming gas containing at least one of hydrogen and chlorine.

10 Claims, 12 Drawing Sheets

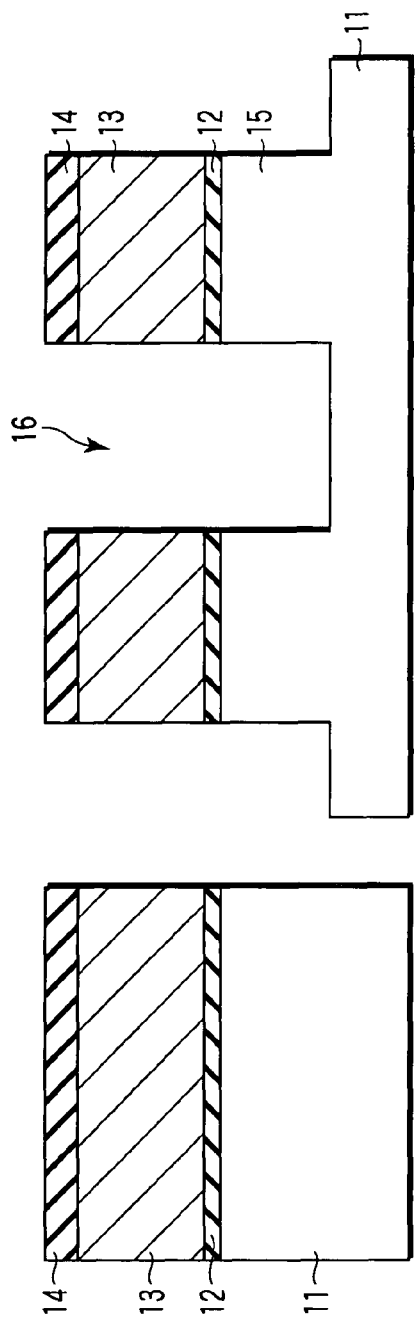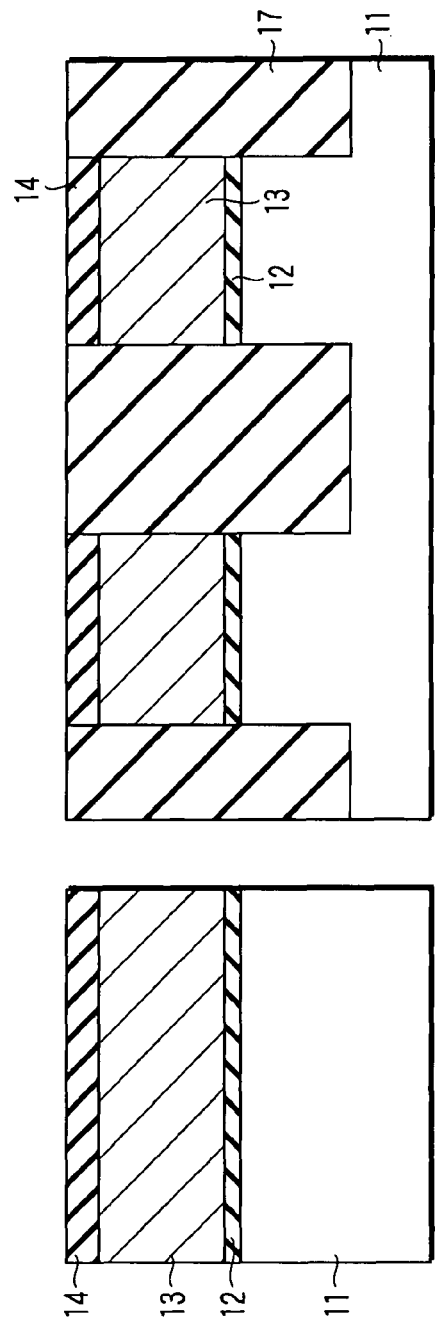

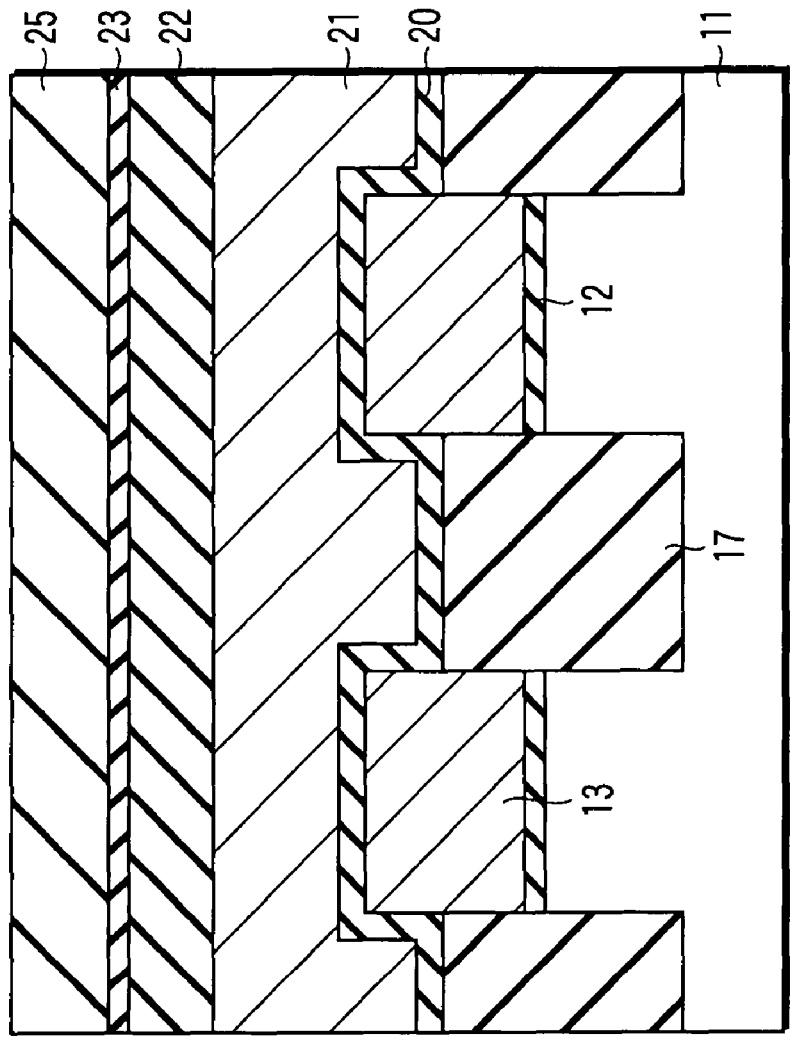
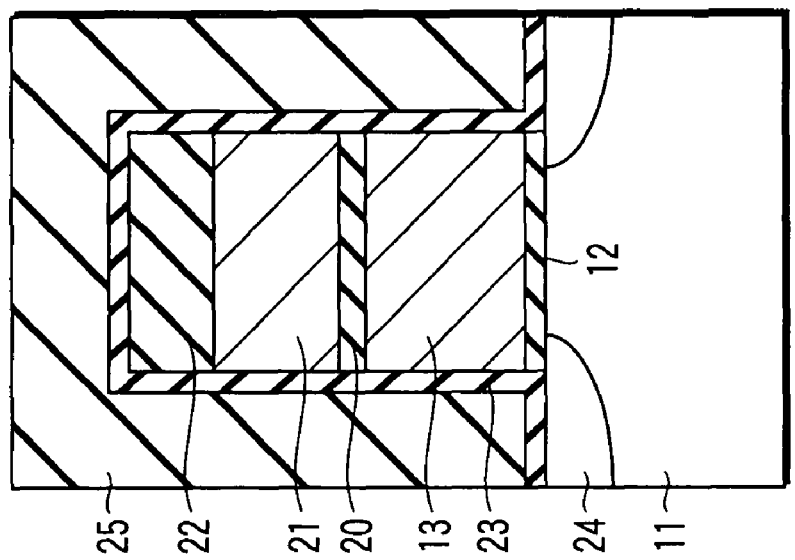
FIG. 5A
FIG. 5B

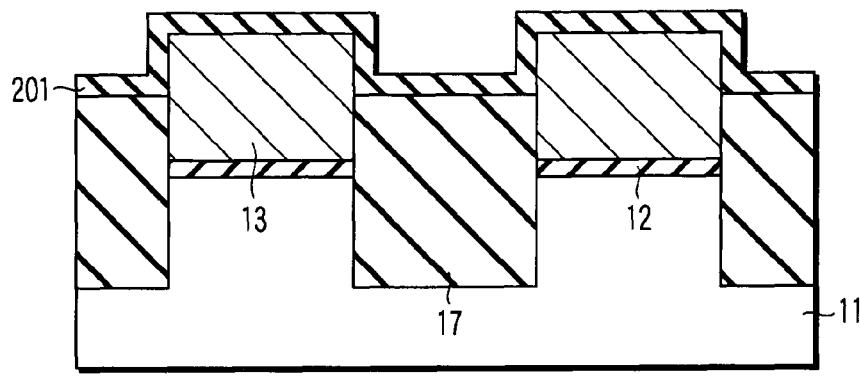
F I G. 6A
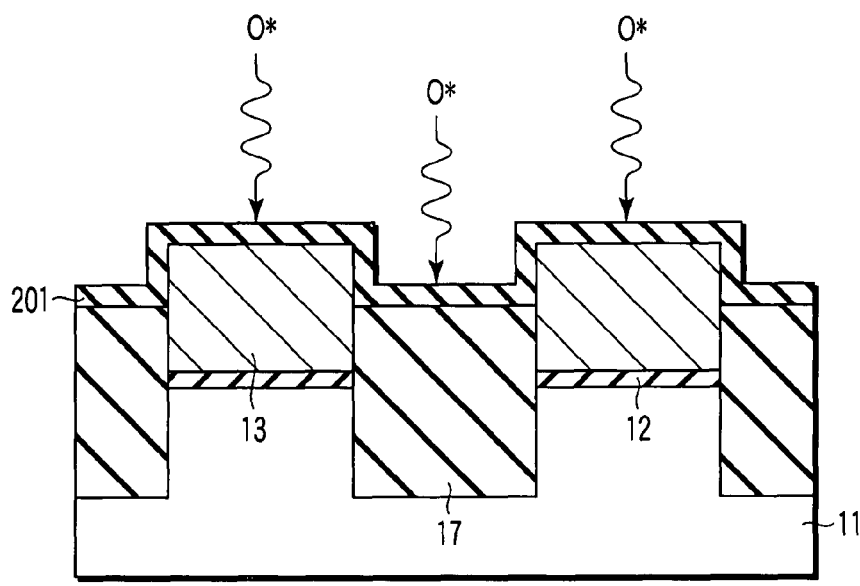
F I G. 6B
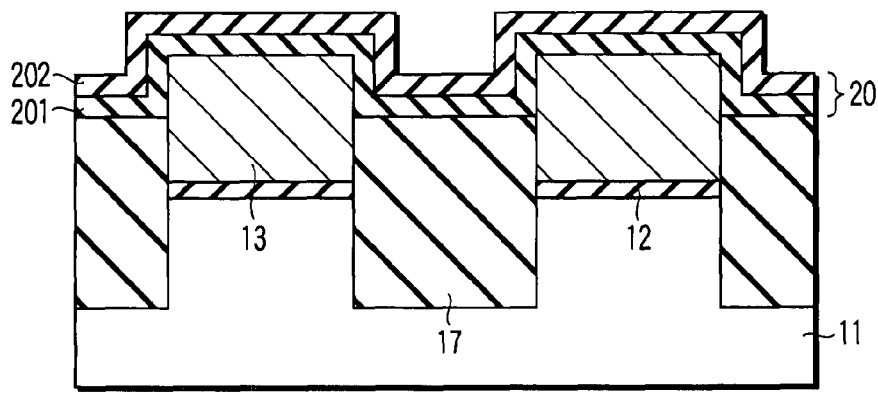
F I G. 6C

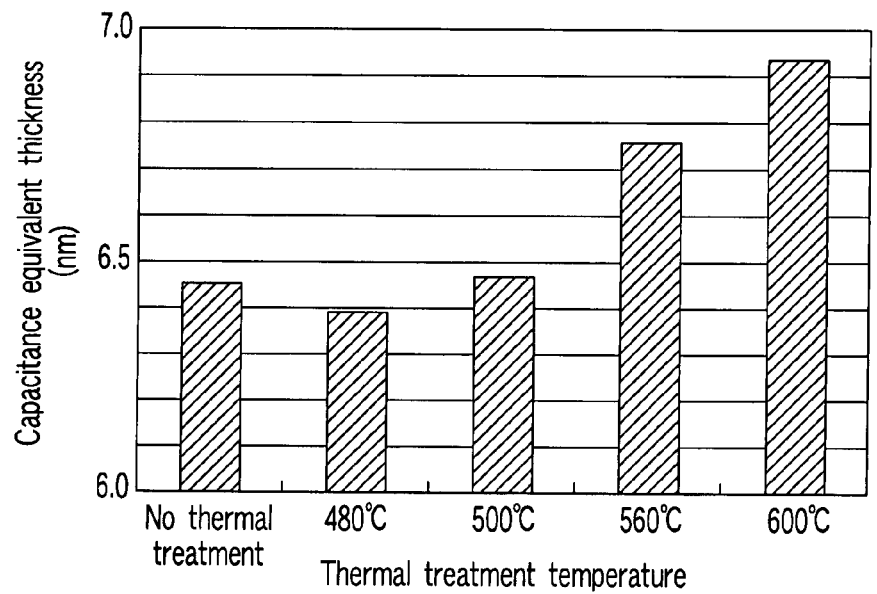
F I G. 7
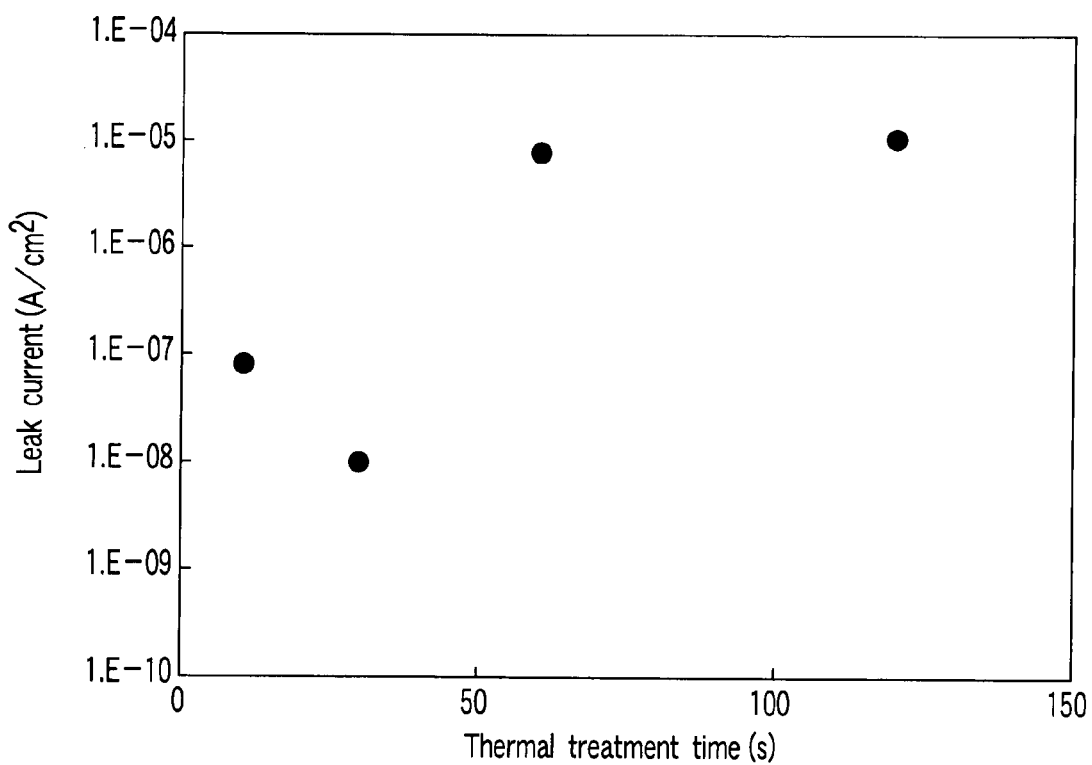
F I G. 8

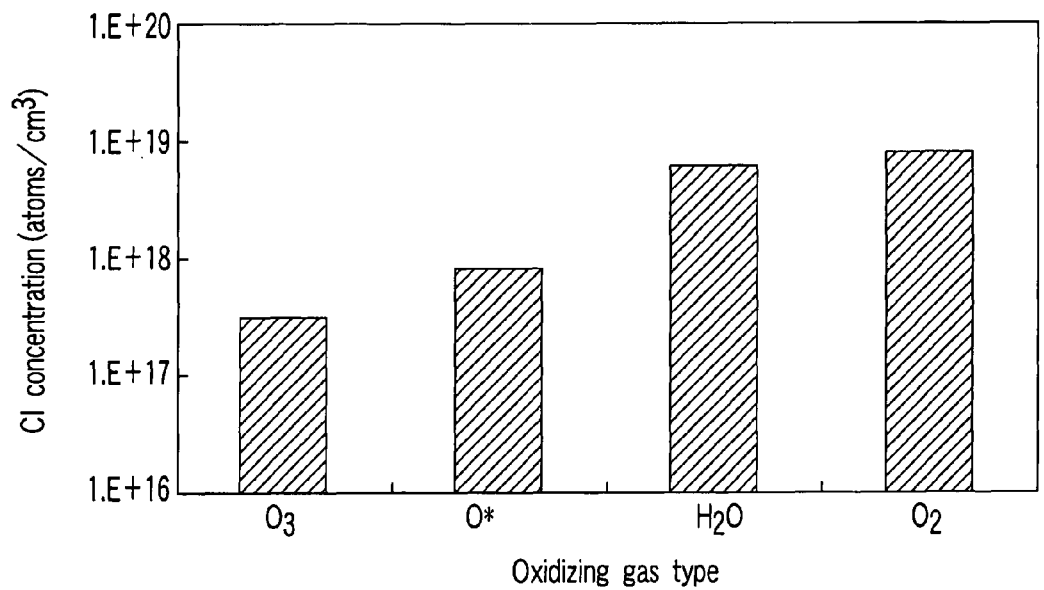
F I G. 10
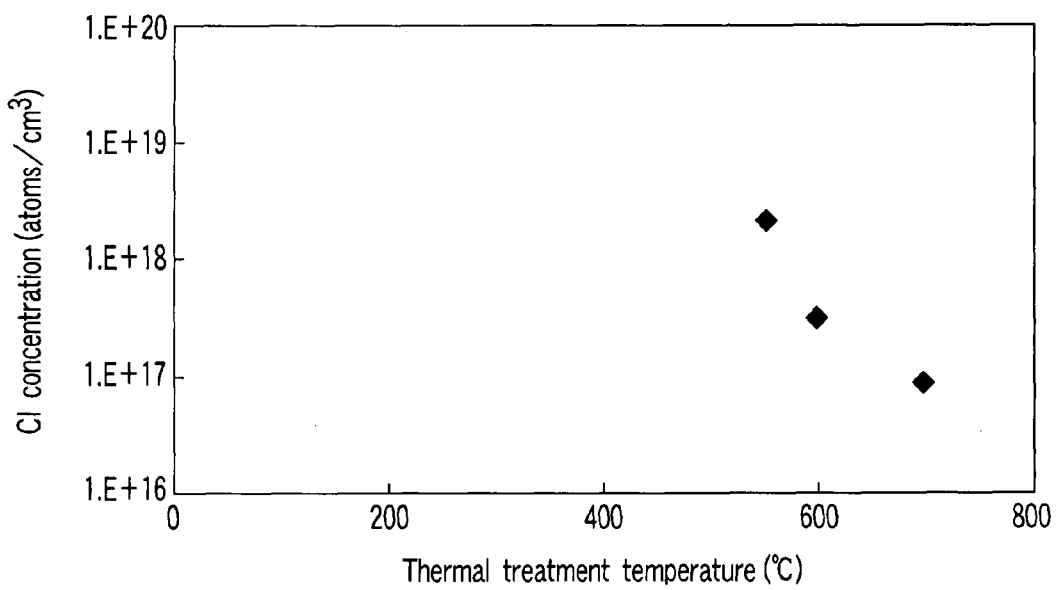
F I G. 11

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2006-112193, filed Apr. 14, 2006, the entire contents of which are incorporated herein by reference.

BACKGROUND OF THE INVENTION

1. Field of the Invention

The present invention relates to a method of manufacturing a semiconductor device.

2. Description of the Related Art

In recent years, a proposal has been made of a nonvolatile semiconductor memory device having, between a control electrode and a charge storage layer, a high-dielectric-constant insulating film containing oxygen and a metal element in order to increase the capacitance between the control electrode and the charge storage layer and to improve charge retention characteristics (see, for example, Jpn. Pat. Appln. KOKAI Publication Nos. 5-129625 and 2003-68897).

However, if a silicon oxide film is deposited on the high-dielectric-constant insulating film, hydrogen or chlorine contained in film forming gas for the silicon oxide film may disadvantageously mix into the high-dielectric-constant insulating film, resulting in a reduction reaction or the like. This may cause oxygen vacancies in the high-dielectric-constant insulating film. Unfortunately, the oxygen vacancies may in turn reduce breakdown voltage, while increasing the amount of leak current and the amount of charge trap and charge detrap.

Thus, it has been difficult to form an excellent insulating film between the control electrode and the charge storage layer owing to problems such as oxygen vacancies attributed to hydrogen or chlorine.

BRIEF SUMMARY OF THE INVENTION

A first aspect of the present invention, there is provided a method of manufacturing a semiconductor device comprising a first insulating film formed on a semiconductor substrate, a charge storage layer formed on the first insulating film, a second insulating film formed on the charge storage layer, and a control electrode formed on the second insulating film, forming the second insulating film comprising: forming a lower insulating film containing oxygen and a metal element; thermally treating the lower insulating film in an atmosphere containing oxidizing gas; and forming an upper insulating film on the thermally treated lower insulating film using film forming gas containing at least one of hydrogen and chlorine.

A second aspect of the present invention, there is provided a method of manufacturing a semiconductor device comprising a first insulating film formed on a semiconductor substrate, a charge storage layer formed on the first insulating film, a second insulating film formed on the charge storage layer, and a control electrode formed on the second insulating film, forming the second insulating film comprising: forming a lower insulating film containing oxygen and a metal element; forming an upper insulating film on the lower insulating film using film forming gas containing at least one of hydrogen and chlorine; and thermally treating the lower insulating film and the upper insulating film in an atmosphere containing oxidizing gas.

BRIEF DESCRIPTION OF THE SEVERAL VIEWS OF THE DRAWING

FIGS. 1A and 1B are sectional views schematically showing a part of the basic process for manufacturing a semiconductor device in accordance with each embodiment of the present invention;

FIGS. 2A and 2B are sectional views schematically showing a part of the basic process for manufacturing a semiconductor device in accordance with each embodiment of the present invention;

FIGS. 5A and 5B are sectional views schematically showing a part of the basic process for manufacturing a semiconductor device in accordance with each embodiment of the present invention;

FIGS. 6A, 6B, and 6C are sectional views showing in detail a part of a process for manufacturing a semiconductor device in accordance with a first embodiment of the present invention;

FIG. 7 is a diagram showing the relationship between thermal treatment temperature and the capacitance equivalent thickness of an inter-electrode insulating film in accordance with the first embodiment of the present invention;

FIG. 8 is a diagram showing the relationship between thermal treatment time and a leak current in accordance with the first embodiment of the present invention;

FIG. 10 is a diagram showing the relationship between the type of oxidizing gas and the concentration of Cl in an alumina film in accordance with the second embodiment of the present invention;

FIG. 11 is a diagram showing the relationship between thermal treatment temperature and the concentration of Cl in the alumina film in accordance with the second embodiment of the present invention;

DETAILED DESCRIPTION OF THE INVENTION

Figure 3A:
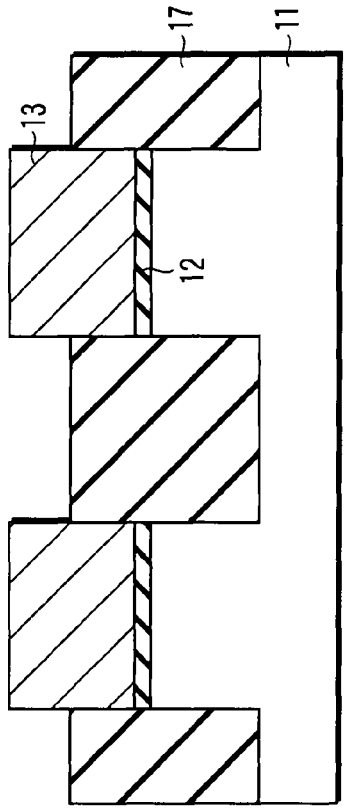
FIGS. 3A and 3B are sectional views schematically showing a part of the basic process for manufacturing a semiconductor device in accordance with each embodiment of the present invention.

Embodiments of the present invention will be described with reference to the drawings.

Embodiment 1

With reference to FIGS. 1A and 1B to 5A and 5B, description will be given of a basic method for manufacturing a semiconductor device (nonvolatile semiconductor memory device) in accordance with the present embodiment. FIGS. 1A to 5A are sectional views in a bit line direction (channel length direction). FIGS. 1B to 5B are sectional views in a word line direction (channel width direction).

First, as shown in FIGS. 1A and 1B, a tunnel insulating film (first insulating film) 12 of thickness 6 nm is formed on a surface of a silicon substrate (semiconductor substrate) 11 with doped impurities by means of thermal oxidation. Subsequently, as a floating gate electrode film 13, a phosphorus-doped polysilicon film of thickness 100 nm is formed by CVD (Chemical Vapor Deposition). A mask film 14 is further formed by CVD.

Then, the mask film 14, polysilicon film 13, tunnel insulating film 12, and silicon substrate 11 are sequentially etched by RIE (Reactive Ion Etching) using a first resist mask (not shown). An element formation area 15 and an isolation trench 16 are thus formed. Both the element formation area 15 and the isolation trench 16 have a width of about 50 nm.

Then, as shown in FIGS. 2A and 2B, a silicon oxide film is formed on the mask film 14 and in the isolation trench 16 as an isolation insulating film 17. The silicon oxide film 17 on the mask film 14 is subsequently removed by CMP (Chemical Mechanical Polishing), with the silicon oxide film 17 left in the isolation trench 16.

Figure 3B:
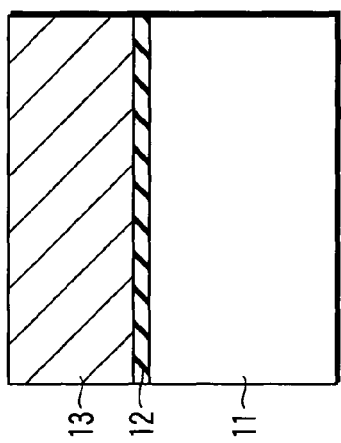

Then, as shown in FIGS. 3A and 3B, the mask film 14 is etched away with a chemical agent to expose a top surface of the polycrystalline silicon film 13. Subsequently, an upper part of the silicon oxide film 17 is etched away with a dilute fluorinated acid solution to expose the upper part of side surfaces of the polycrystalline silicon film 13. The exposed side surfaces have a height of about 50 nm.

Figure 4A:
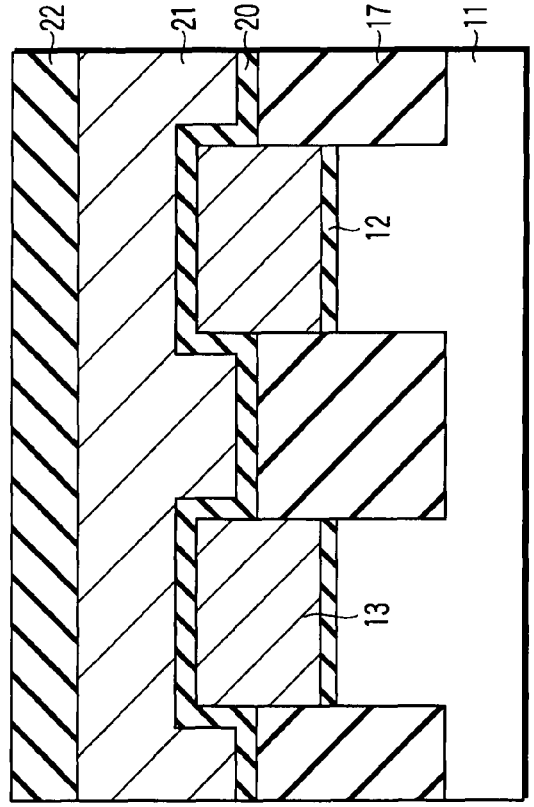
FIGS. 4A and 4B are sectional views schematically showing a part of the basic process for manufacturing a semiconductor device in accordance with each embodiment of the present invention.
Figure 4B:
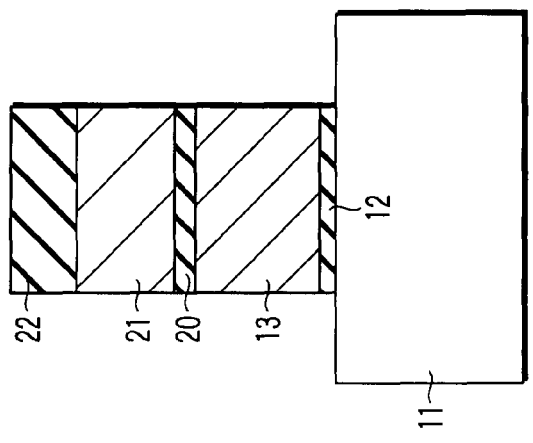

Then, as shown in FIGS. 4A and 4B, an inter-electrode insulating film (second insulating film) 20 is formed all over the surface of the resulting structure. The inter-electrode insulating film 20 will be described later in detail. A control gate electrode film 21 of thickness 100 nm is subsequently formed on the inter-electrode insulating film 20. The control gate electrode film 21 has a stack structure including a polycrystalline silicon film and a tungsten silicide film. A silicon nitride film is further formed by CVD as a mask film 22 for RIE.

Then, a second resist mask (not shown) having a pattern orthogonal to a pattern of the first resist mask is formed on the silicon nitride film 22. Subsequently, the mask film 22, control gate electrode film 21, inter-electrode insulating film 20, polycrystalline silicon film 13, and tunnel insulating film 12 are sequentially etched by RIE using the second resist mask. A floating gate electrode (charge storage layer) 13 and a control gate electrode (control electrode) 21 are thus formed. The width of the floating gate electrode 13 and the distance between the floating gate electrodes 13 are both about 50 nm.

Then, as shown in FIGS. 5A and 5B, a gate sidewall insulating film 23 of thickness about 10 nm is formed by thermal oxidation and CVD so as to cover the gate structure obtained in the step shown in FIGS. 4A and 4B. An impurity diffusion layer 24 constituting a source/drain area is subsequently formed by ion implantation and thermal annealing. An inter-layer insulating film 25 is subsequently formed by CVD or the like. Interconnections (not shown) are further formed using a well-known technique.

As described above, a nonvolatile semiconductor memory device is obtained which comprises the tunnel insulating film (first insulating film; capacitance C1) 12 formed on the silicon substrate (semiconductor substrate) 11, the floating gate electrode (charge storage layer) 13 formed on the tunnel insulating film 12, the inter-electrode insulating film (second insulating film; capacitance C2) 20 formed on the floating gate electrode 13, the control gate electrode (control electrode) 21 formed on the inter-electrode insulating film 20, and the impurity diffusion layers 24 sandwiching a channel area under the floating gate electrode 13.

In each memory cell in the nonvolatile semiconductor memory device thus obtained, application of a high voltage between the silicon substrate 11 and the control gate electrode 21 applies an electric field according to a coupling ratio (C2/(C1+C2)) to the tunnel insulating film 12. As a result, a tunnel current passes through the tunnel insulating film 12. This changes the amount of charge stored in the floating gate electrode 13 and thus the threshold of the memory cell, allowing a data writing or erasing operation to be performed.

An actual nonvolatile semiconductor memory device has a plurality of memory cells arranged in a word line direction and in a bit line direction. A typical nonvolatile semiconductor memory device is a NAND type nonvolatile memory having a plurality of series connected memory cells provided between a pair of select transistors.

The above description relates to the basic configuration of the nonvolatile semiconductor memory device and the basic method for manufacturing the nonvolatile semiconductor memory device, which are also applied to other embodiments described below.

FIGS. 6A, 6B, and 6C are sectional views showing in detail a part of the process of manufacturing a semiconductor device shown in FIGS. 1A and 1B to 5A and 5B, in the word line direction (channel width direction). Components corresponding to those shown in FIGS. 1A and 1B to FIGS. 5A and 5B are denoted by the same reference numerals, and their detailed description is omitted.

After the step shown in FIGS. 3A and 3B, a lower insulating film containing oxygen and a metal element is formed on the exposed surfaces of the polycrystalline silicon film (floating gate electrode film) 13 and the silicon oxide film (isolation insulating film) 17 as shown in FIG. 6A. Specifically, as a lower insulating film, an aluminum oxide film (alumina film; $Al_2O_3$ film) 201 of thickness 5 nm is deposited by ALD (Atomic Layer Deposition). The alumina film 201 is formed by using trimethyl aluminum and steam (water vapor) as source gas (film forming gas). Film forming temperature is 300° C. The alumina film 201 is a high-dielectric-constant insulating film having a relative dielectric constant of more than 7, which is higher than that (about 7) of a typical silicon nitride film ($Si_3N_4$). The lower insulating film preferably has a higher dielectric constant than an upper insulating film described below.

Then, as shown in FIG. 6B, the alumina film 201 is thermally treated in an atmosphere containing oxidizing gas.

Specifically, oxygen gas having a partial pressure of 10 Pa and argon gas having a partial pressure of 30 Pa are introduced into a reaction furnace. Radical oxidation is performed at 500° C. for 30 seconds using oxygen radicals (O*) generated by plasma, to reform (modify) the alumina film 201.

Then, as shown in FIG. 6C, a silicon oxide film 202 of thickness 5 nm is formed on the thermally treated alumina film 201 by CVD as an upper insulating film. The silicon oxide film 202 is formed using film forming gas containing at least one of hydrogen and chlorine. Specifically, the silicon oxide film 202 is formed using dinitrogen monoxide and dichlorosilane as source gas (film forming gas). The film forming temperature is 800° C.

Thus, the inter-electrode insulating film 20 formed of the alumina film 201 and silicon oxide film 202 is obtained. The subsequent steps are similar to those shown in FIGS. 1A and 1B to 5A and 5B.

As described above, the present embodiment executes a radical oxidation treatment as a thermal treatment in an atmosphere containing oxidizing gas. The radical oxidation treatment pre-reforms the alumina film (lower insulating film) 201. This prevents the alumina film 201 from being affected, for example, from undergoing film quality degradation (oxygen vacancies or the like), in spite of the use of a film forming gas containing at least one of hydrogen and chlorine for forming a silicon oxide film (upper insulating film) 202. This provides an excellent inter-electrode insulating film 20, making it possible to prevent an increase in leak current during a writing operation, an erasing operation, or charge retention operation and an increase in the amount of charge trap and charge detrap of the inter-electrode insulating film. This in turn makes it possible to prevent malfunction resulting from a variation in the threshold of a memory cell and to increase the speed of memory cell operations.

As described above, the present embodiment reforms (modifies) the inter-electrode insulating film 20 by radical oxidation using oxygen radicals. Radical oxidation has very strong oxidizing power but offers a short length of invasion into an insulating film, such as an alumina film, which contains oxygen and a metal element. This enables the inter-electrode insulating film to be reformed without oxidizing the lower interface of the inter-electrode insulating film 20. That is, the inter-electrode insulating film can be reformed without increasing the thickness of the inter-electrode insulating film 20. In particular, the above method is suitable for the reformation of vicinity of the surface of an insulating film containing oxygen and a metal element.

The effects of radical oxidation using oxygen radicals are as described below. With radical oxidation, after the lower insulating film 201 is formed by deposition, defects present near the surface of the lower insulating film 201 are compensated for by oxygen atoms. During the deposition of the upper insulating film 202, impurities such as chlorine and hydrogen diffuse through the lower insulating film 201 via defects in the film 201. Thus, a pre-reduction of defects near the surface of the lower insulating film 201 enables the prevention of possible diffusion of impurities (chlorine and hydrogen). This enables the prevention of possible oxygen vacancies in the lower insulating film 201 resulting from the mixture of chlorine or hydrogen. Further, reforming the vicinity of surface of the lower insulating film 201 enables a sharp reduction in defects that may occur at the interface between the lower insulating film 201 and the upper insulating film 202 when the upper insulating film 202 is formed by deposition. Interface defects function as charge trap sites. Consequently, thermal treatment in an oxygen radical atmosphere is also effective for reducing the amount of charge trap and charge detrap.

Another method may be used to generate oxygen radicals. For example, hydrogen gas and oxygen gas may be introduced into a reaction furnace so as to react thermally with each other to generate oxygen radicals.

The effects of the present embodiment can be produced similarly or to some degree even if a reforming (modifying) thermal treatment is performed using another oxidizing gas such as oxygen gas ($O_2$ gas), ozone gas ($O_3$ gas), or steam ($H_2O$ vapor).

FIG. 7 shows the relationship between a thermal treatment temperature for radical oxidation and the capacitance equivalent thickness Tox of the inter-electrode insulating film. Here, the capacitance equivalent thickness Tox is equivalent film thickness of the silicon oxide film and is calculated on the basis of the ratio of the dielectric constant of the silicon oxide film to the dielectric constant of the inter-electrode insulating film. Tox increases significantly at a thermal treatment temperature of at least 560° C. This is because at high temperatures, oxygen radicals completely permeate the lower insulating film, oxidizing the lower interface of the lower insulating film. It has also been found that too low a radical oxidation temperature lowers the above reforming effect. Thus, the thermal treatment temperature is desirably at least 200° C.

FIG. 8 shows the relationship between thermal treatment time (thermal treatment temperature is 500° C.) and a leak current generated with a 5-MV/cm electric field applied. The leak current value is smallest when the thermal treatment time is about 30 seconds, and increases consistently with the thermal treatment time. This is because the long exposure of the insulating film surface to the radical atmosphere damages the film surface, degrading the electrical characteristics of the film.

Thus, desirable conditions for the reforming thermal treatment based on radical oxidation include a temperature range from 200° C. to 560° C. and a treatment time of shorter than 60 seconds.

Embodiment 2

A second embodiment of the present invention will be described below. The basic configuration and the basic method for manufacturing in accordance with the present embodiment are similar to those in the first embodiment, shown in FIGS. 1A and 1B to 5A and 5B, and will thus not be described in detail. Further, the matters described in the first embodiment will not be described in detail.

Figure 9A:
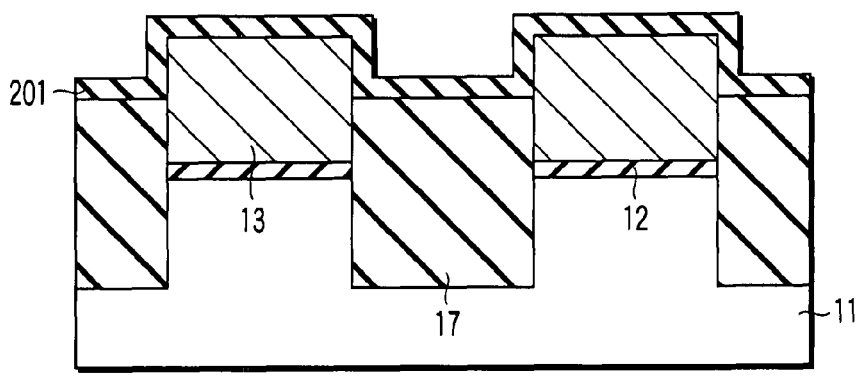
FIGS. 9A, 9B, and 9C are sectional views showing in detail a part of a process for manufacturing a semiconductor device in accordance with a second embodiment of the present invention.
Figure 9B:
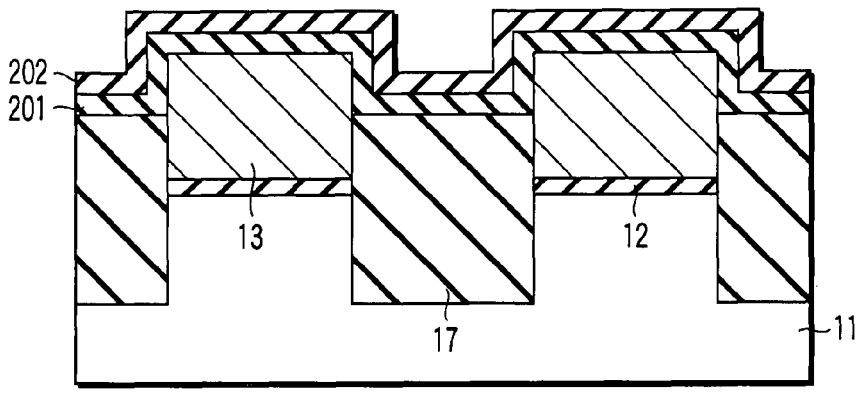
Figure 9C:
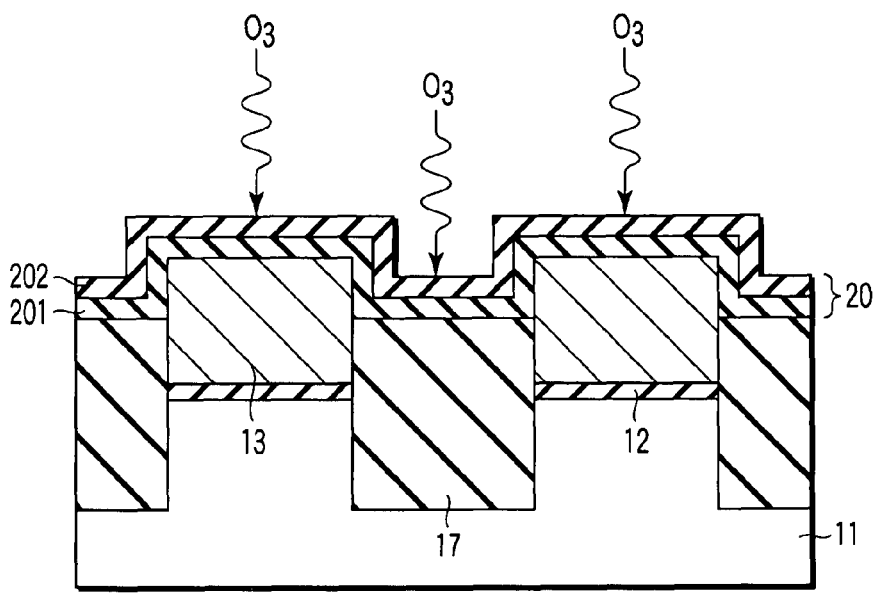

FIGS. 9A, 9B, and 9C are sectional views showing in detail a part of a process of manufacturing a semiconductor device in accordance with the present embodiment, in the word line direction (channel width direction). Components corresponding to those shown in FIGS. 1A and 1B to FIGS. 5A and 5B are denoted by the same reference numerals, and their detailed description is omitted.

After the step shown in FIGS. 3A and 3B, a lower insulating film containing oxygen and a metal element is formed on the exposed surfaces of the polycrystalline silicon film (floating gate electrode film) 13 and the silicon oxide film (isolation insulating film) 17 as shown in FIG. 9A. Specifically, as a lower insulating film, an aluminum oxide film (alumina film; $Al_2O_3$ film) 201 of thickness 5 nm is deposited by ALD. The alumina film 201 is formed by using trimethyl aluminum and steam (water vapor) as source gas (film forming gas). The film forming temperature is 300° C.

Then, as shown in FIG. 9B, a silicon oxide film 202 of thickness 5 nm is formed on the alumina film 201 by CVD as an upper insulating film. The silicon oxide film 202 is formed using film forming gas containing at least one of hydrogen and chlorine. Specifically, the silicon oxide film 202 is formed using dinitrogen monoxide and dichlorosilane as source gas (film forming gas). The film forming temperature is 800° C.

Then, as shown in FIG. 9C, the alumina film 201 and silicon oxide film 202 are thermally treated in an atmosphere containing oxidizing gas. Specifically, thermal treatment is executed at 600° C. for one minute in an atmosphere containing ozone ($O_3$) gas at a pressure of 400 Pa, to reform the alumina film 201 and the like.

Thus, the inter-electrode insulating film 20 formed of the alumina film 201 and silicon oxide film 202 is obtained. The subsequent steps are similar to those shown in FIGS. 1A and 1B to 5A and 5B.

As described above, the present embodiment uses film forming gas containing at least one of hydrogen and chlorine to form a silicon oxide film (upper insulating film) 202 by deposition. This may degrade the film quality of the alumina film (lower insulating film layer) 201 (oxygen vacancies or the like may occur). However, the present embodiment subsequently executes thermal treatment in an ozone gas atmosphere as a thermal treatment in an atmosphere containing oxidizing gas. The alumina film 201 can thus be reformed. This provides an excellent inter-electrode insulating film 20, making it possible to prevent an increase in leak current during a writing operation, an erasing operation, or charge retention operation. This in turn makes it possible to prevent malfunction resulting from a variation in the threshold of a memory cell and to increase the speed of memory cell operations.

As described above, the present embodiment reforms (modifies) the inter-electrode insulating film 20 in an atmosphere containing ozone gas. FIG. 10 shows the concentration of Cl in the alumina film 201 observed when a reforming thermal treatment is executed using oxygen ($O_2$), steam ($H_2O$ vapor), oxygen radicals (O*), or ozone ($O_3$) after the silicon oxide film 202 is formed by deposition. As shown in FIG. 10, among these oxidizing gases, ozone most sharply reduces the Cl concentration via thermal treatment. Owing to its strong oxidizing power, ozone is most excellent in the ability to oxidize and remove impurities (hydrogen and chlorine) mixed into the alumina film 201. Therefore, ozone is suitable for reforming the film by reducing impurities mixed into the lower insulating film as is the case with the present embodiment.

The effects of ozone gas are as described below. Ozone sufficiently oxidizes impurities (hydrogen and chlorine) mixed into the lower insulating film 201, allowing oxidized impurities to be removed from the film as volatile substances. This makes it possible to reduce oxygen vacancies resulting from the mixture of chlorine or hydrogen. Further, at the same time, the ozone is partly decomposed to generate oxygen. Oxygen has a long length of invasion into the insulating film. Ozone is thus effective for reforming the entire inter-electrode insulating film 20 and for compensating for oxygen vacancies in the inter-electrode insulating film 20.

The effects of the present embodiment can be produced similarly or to some degree even if a reforming thermal treatment is performed using another oxidizing gas such as oxygen gas, oxygen radicals, or steam (water vapor).

Figure 12:
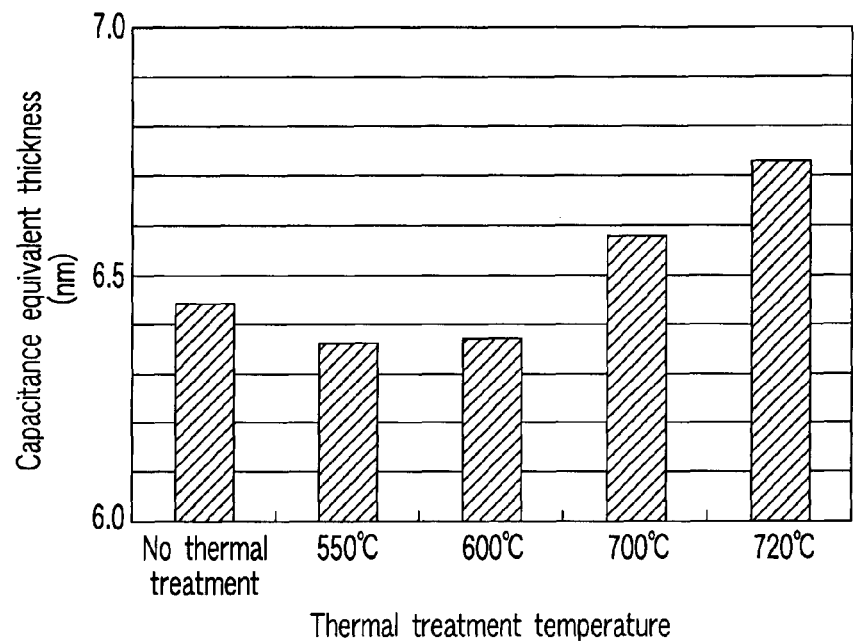
FIG. 12 is a diagram showing the relationship between thermal treatment temperature and the capacitance equivalent thickness of an inter-electrode insulating film in accordance with the second embodiment of the present invention.

FIG. 11 shows the relationship between a thermal treatment temperature in an ozone atmosphere and the concentration of impurities (chlorine) in the alumina film. As shown in FIG. 11, the level of the chlorine removing effect increases consistently with the thermal treatment temperature. FIG. 12 shows the relationship between the thermal treatment temperature in the ozone atmosphere and the capacitance equivalent thickness Tox of the thermally treated inter-electrode insulating film. As shown in FIG. 12, Tox increases at 700° C. or higher. This is because an oxidizer completely permeates through the inter-electrode insulating film, oxidizing the lower interface of the inter-electrode insulating film. Thus, the temperature for a reforming thermal treatment using ozone is desirably lower than 700° C., particularly desirably between 500 and 700° C. Moreover, a thermal treatment at a high temperature and a low partial pressure enables both the inhibition of an increase in Tox and the reduction of impurities.

Embodiment 3

A third embodiment of the present invention will be described below. The basic configuration and the basic method for manufacturing in accordance with the present embodiment are similar to those in the first embodiment, shown in FIGS. 1A and 1B to 5A and 5B, and will thus not be described in detail. Further, the matters described in the first embodiment will not be described in detail.

Figure 13A:
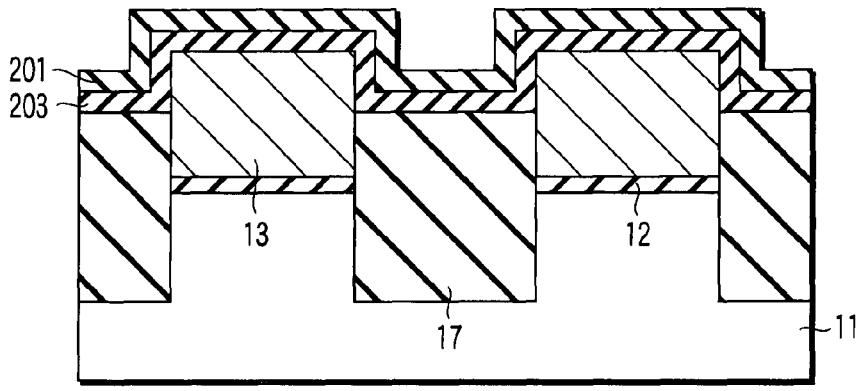
FIGS. 13A, 13B, and 13C are sectional views showing in detail a part of a process for manufacturing a semiconductor device in accordance with a third embodiment of the present invention.
Figure 13B:
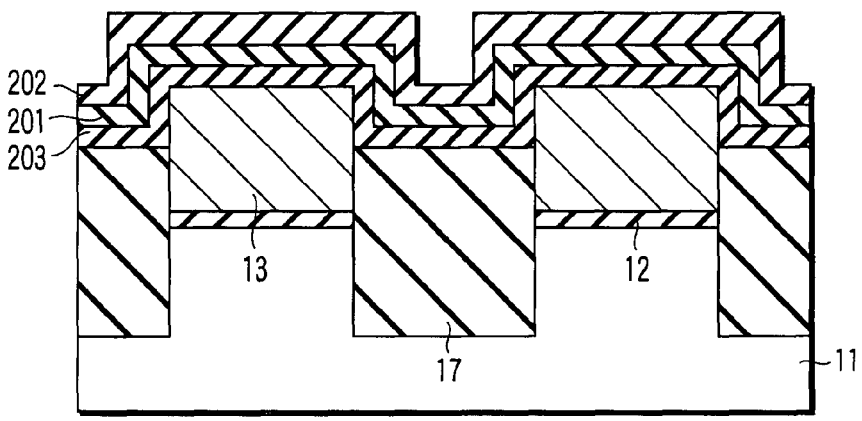
Figure 13C:
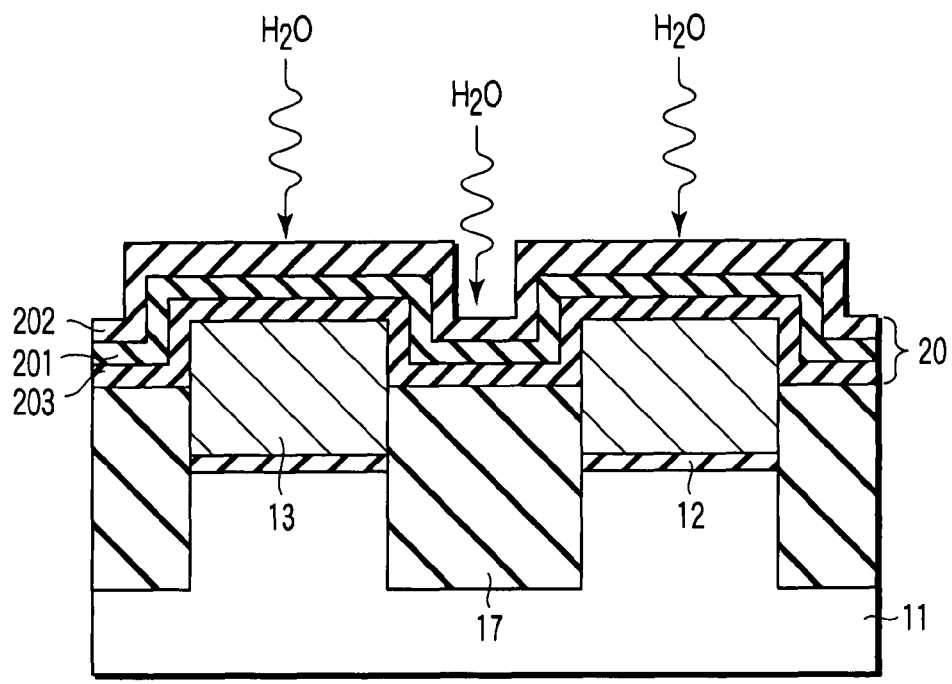

FIGS. 13A, 13B, and 13C are sectional views showing in detail a part of a process of manufacturing a semiconductor device in accordance with the present embodiment, in the word line direction (channel width direction). Components corresponding to those shown in FIGS. 1A and 1B to FIGS. 5A and 5B are denoted by the same reference numerals, and their detailed description is omitted.

After the step shown in FIGS. 3A and 3B, an insulating film containing oxygen is formed on the exposed surfaces of the polycrystalline silicon film (floating gate electrode film) 13 and the silicon oxide film (isolation insulating film) 17 as shown in FIG. 13A. Specifically, as an insulating film containing oxygen, a silicon oxide film 203 of thickness 5 nm is formed by radical oxidation. Subsequently, as a lower insulating film containing oxygen and a metal element, an aluminum oxide film (alumina film; $Al_2O_3$ film) 201 of thickness 2 nm is formed by ALD. The alumina film 201 is formed by using trimethyl aluminum and steam as source gas (film forming gas). The film forming temperature is 300° C.

Then, as shown in FIG. 13B, a silicon oxide film 202 of thickness 5 nm is formed on the alumina film 201 by CVD as an upper insulating film. The silicon oxide film 202 is formed using film forming gas containing at least one of hydrogen and chlorine. Specifically, the silicon oxide film 202 is formed using dinitrogen monoxide and dichlorosilane as source gas (film forming gas). The film forming temperature is 800° C.

Then, as shown in FIG. 13C, the alumina film 201, silicon oxide film 202, and silicon oxide film 203 are thermally treated in an atmosphere containing oxidizing gas. Specifically, thermal treatment is executed at 850° C. for 30 minutes in an atmosphere containing steam ($H_2O$ vapor) at a pressure of 80 kPa, to reform the alumina film 201 and the like.

Thus, the inter-electrode insulating film 20 formed of the alumina film 201, silicon oxide film 202, and silicon oxide film 203 is obtained. The subsequent steps are similar to those shown in FIGS. 1A and 1B to 5A and 5B.

As described above, the present embodiment uses film forming gas containing at least one of hydrogen and chlorine to form a silicon oxide film 202 by deposition. This may degrade the film quality of the alumina film 201 (oxygen vacancies or the like may occur). However, the present embodiment subsequently executes thermal treatment in a steam (water vapor) atmosphere as a thermal treatment in an atmosphere containing oxidizing gas. The alumina film 201 can thus be reformed. This makes it possible to reduce the amount of charge trap and charge detrap of the inter-electrode insulating film 20 of the multilayer structure and to prevent malfunction resulting from a variation in the threshold of a memory cell. Oxygen vacancies in the inter-electrode insulating film 20 of the multilayer structure can also be compensated for. This enables a reduction in leak current during writing and erasing operations and an increase in the speed of memory cell operations.

As described above, the present embodiment reforms (modifies) the inter-electrode insulating film 20 and the like in an atmosphere containing steam (water vapor). Steam exerts high diffusion power in an insulating film such as an alumina film which contains oxygen and a metal element. Thus, steam fully spreads throughout the inter-electrode insulating film 20 of multilayer structure, allowing the entire inter-electrode insulating film 20 to be reformed. Further, the method in accordance with the present embodiment exerts a high reforming effect on an interface containing a large number of dangling bonds, such as the one between insulating films formed of different materials. Therefore, the method in accordance with the present embodiment is suitable for reforming the inter-electrode insulating film 20 of the multilayer structure.

The effects of steam (water vapor) are as described below. Steam diffuses through an insulating film while terminating oxygen vacancies. Steam thus has a high ability to compensate for oxygen vacancies. Steam also has a high ability to terminate defects at the interface between insulating films formed of different materials and at the interface between a silicon substrate and an insulating film. Since interface defects serve as trap sites for charge, the thermal treatment in a steam atmosphere is effective for reducing the amount of charge trap and charge detrap. Therefore, the reforming thermal treatment using steam is particularly effective on an inter-electrode insulating film of a multilayer structure having a lot of interfaces between insulating films formed of different materials.

The effects of the present embodiment can be produced similarly or to some degree even if a reforming thermal treatment is performed using another oxidizing gas such as ozone gas, oxygen gas, or oxygen radicals.

Figure 14:
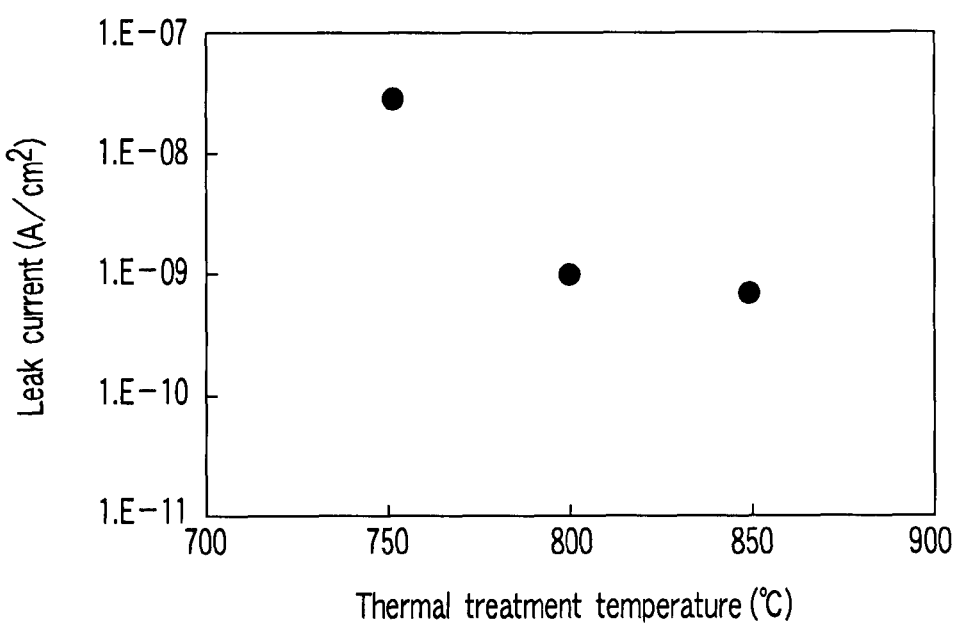
FIG. 14 is a diagram showing the relationship between thermal treatment temperature and a leak current in accordance with the third embodiment of the present invention.
Figure 15:
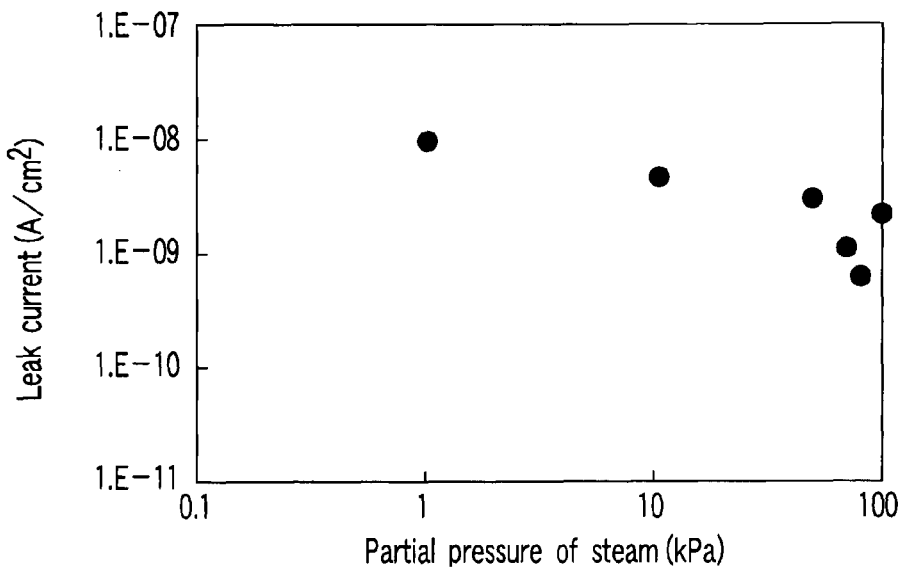
FIG. 15 is a diagram showing the relationship between the partial pressure of steam and a leak current in accordance with the third embodiment of the present invention.

FIG. 14 shows the relationship between a thermal treatment temperature in a steam atmosphere and a leak current of the inter-electrode insulating film observed with a 5-MV/cm electric field applied. FIG. 15 shows the relationship between the partial pressure of steam during thermal treatment (temperature: 850° C.) and a leak current of the inter-electrode insulating film observed with a 5-MV/cm electric field applied. As shown in FIG. 14, the leak current tends to decrease with increasing thermal treatment temperature but to be saturated at 800° C. or higher. The partial pressure of steam tends to be minimized at about 80 kPa. This indicates that as conditions for a reforming thermal treatment using steam, the temperature is desirably at least 800° C. and the partial pressure of steam is at least 10 kPa, particularly desirably between 70 to 90 kPa.

Like the second embodiment, the present embodiment forms a silicon oxide film (upper insulating film) 202 on the alumina film (lower insulating film) 201 and then executes thermal treatment in an atmosphere containing oxidizing gas (in the present embodiment, steam). However, as is the case with the first embodiment, after the formation of an alumina film (lower insulating film) 201, thermal treatment in an atmosphere containing oxidizing gas (in the present embodiment, steam) may be executed before the formation of a silicon oxide film (upper insulating film) 202. This method is particularly effective if the upper insulating film is composed of a material that cannot be easily permeated by oxidizing gas.

Embodiment 4

A fourth embodiment of the present invention will be described below. The basic configuration and the basic method for manufacturing in accordance with the present embodiment are similar to those in the first embodiment, shown in FIGS. 1A and 1B to 5A and 5B, and will thus not be described in detail. Further, the matters described in the first embodiment will not be described in detail.

Figure 16A:
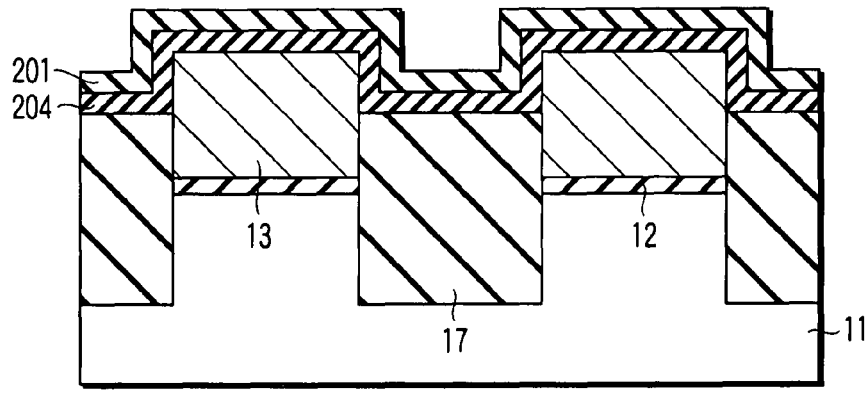
FIGS. 16A, 16B, and 16C are sectional views showing in detail a part of a process for manufacturing a semiconductor device in accordance with a fourth embodiment of the present invention.
Figure 16B:
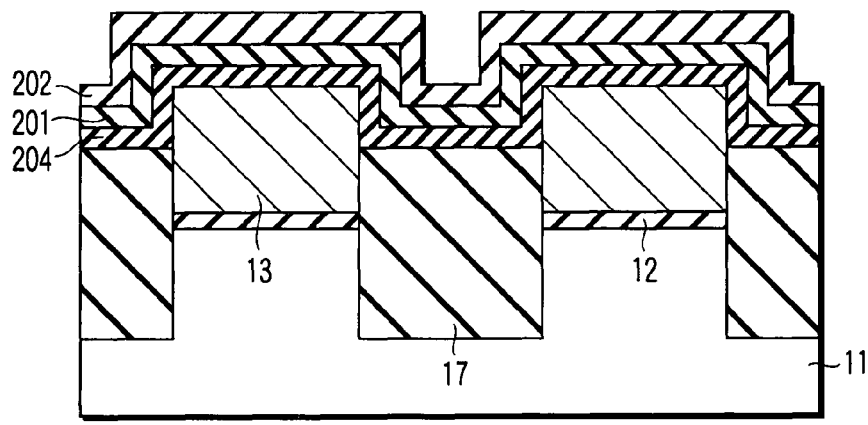
Figure 16C:
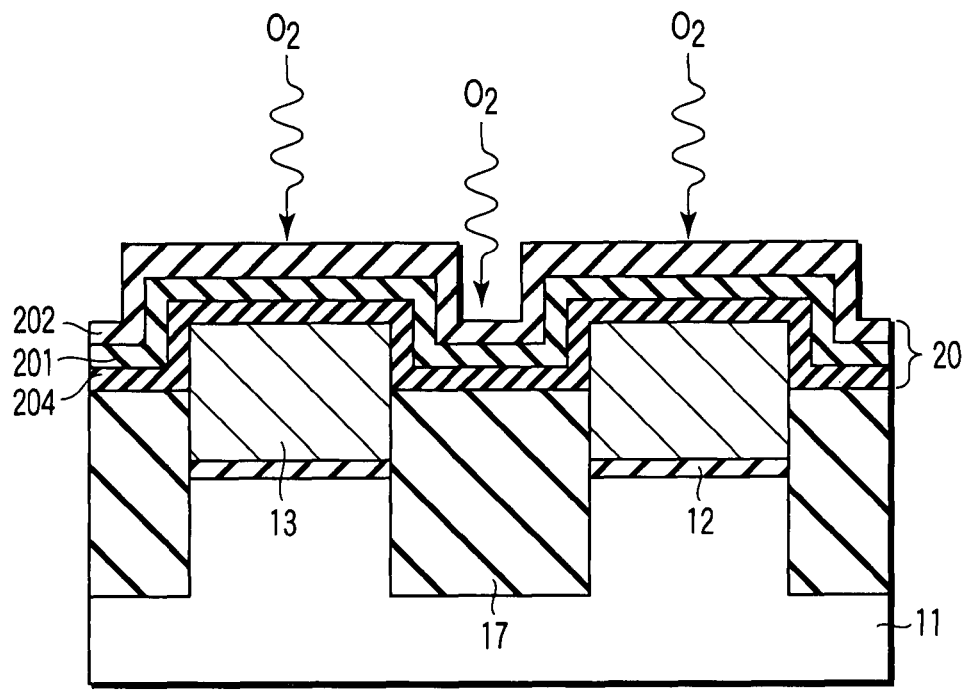

FIGS. 16A, 16B, and 16C are sectional views showing in detail a part of a process of manufacturing a semiconductor device in accordance with the present embodiment, in the word line direction (channel width direction). Components corresponding to those shown in FIGS. 1A and 1B to FIGS. 5A and 5B are denoted by the same reference numerals, and their detailed description is omitted.

After the step shown in FIGS. 3A and 3B, an insulating film containing nitrogen is formed on the exposed surfaces of the polycrystalline silicon film (floating gate electrode film) 13 and the silicon oxide film (isolation insulating film) 17 as shown in FIG. 16A. Specifically, as an insulating film containing nitrogen, a silicon nitride film 204 of thickness 3 nm is formed by radical nitriding. Subsequently, as a lower insulating film containing oxygen and a metal element, an aluminum oxide film (alumina film; $Al_2O_3$ film) 201 of thickness 2 nm is formed by ALD. The alumina film 201 is formed by using trimethyl aluminum and steam as source gas (film forming gas). The film forming temperature is 300° C.

Then, as shown in FIG. 16B, a silicon oxide film 202 of thickness 5 nm is formed on the alumina film 201 by CVD as an upper insulating film. The silicon oxide film 202 is formed using a film forming gas containing at least one of hydrogen and chlorine. Specifically, the silicon oxide film 202 is formed using dinitrogen monoxide and dichlorosilane as source gas (film forming gas). The film forming temperature is 800° C.

Then, as shown in FIG. 16C, the alumina film 201, silicon oxide film 202, and silicon nitride film 204 are thermally treated in an atmosphere containing oxidizing gas. Specifically, thermal treatment is executed at 900° C. for one hour in an atmosphere containing oxygen gas ($O_2$ gas) at a pressure of 80 kPa, to reform the alumina film 201 and the like.

Thus, the inter-electrode insulating film 20 formed of the alumina film 201, silicon oxide film 202, and silicon nitride film 204 is obtained. The subsequent steps are similar to those shown in FIGS. 1A and 1B to 5A and 5B.

As described above, the present embodiment uses film forming gas containing at least one of hydrogen and chlorine to form a silicon oxide film 202 by deposition. This may degrade the film quality of the alumina film 201 (oxygen vacancies or the like may occur). However, the present embodiment subsequently executes thermal treatment in an oxygen gas atmosphere as a thermal treatment in an atmosphere containing oxidizing gas. The alumina film 201 can thus be reformed. This provides an excellent inter-electrode insulating film 20, making it possible to prevent an increase in leak current during a writing operation, an erasing operation, or charge retention operation as well as an increase in the amount of charge trap and charge detrap. This in turn enables the prevention of malfunction resulting from a variation in the threshold of a memory cell as well as an increase in the speed of memory cell operations.

As described above, the present embodiment reforms (modifies) the inter-electrode insulating film 20 in an atmosphere containing oxygen gas. Oxygen gas offers a very long length of invasion into an insulating film such as an alumina film which contains oxygen and a metal element. Oxygen gas thus fully spreads throughout the alumina film 201 and silicon oxide film 202. Further, the silicon nitride film 204, which is unlikely to be oxidized, is formed in the lowermost layer of the inter-electrode insulating film 20. Consequently, a long thermal treatment at high temperatures can be executed without oxidizing the lower interface of the silicon nitride film 204, formed in the lowermost layer. This enables adequate reformation. That is, a long thermal treatment at high temperatures can be achieved without increasing the film thickness of the inter-electrode insulating film 20. This enables adequate reformation.

The effects of the present embodiment can be produced similarly or to some degree even if a reforming thermal treatment is performed using another oxidizing gas such as ozone gas, steam (water vapor), or oxygen radicals.

Figure 17:
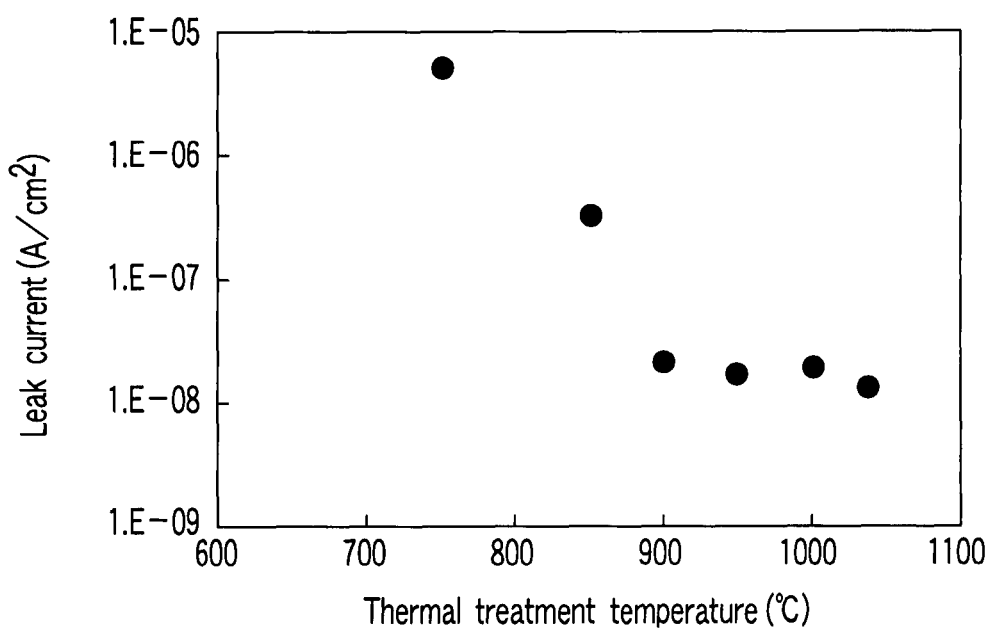
FIG. 17 is a diagram showing the relationship between thermal treatment temperature and leak current in accordance with the fourth embodiment of the present invention.
Figure 18:
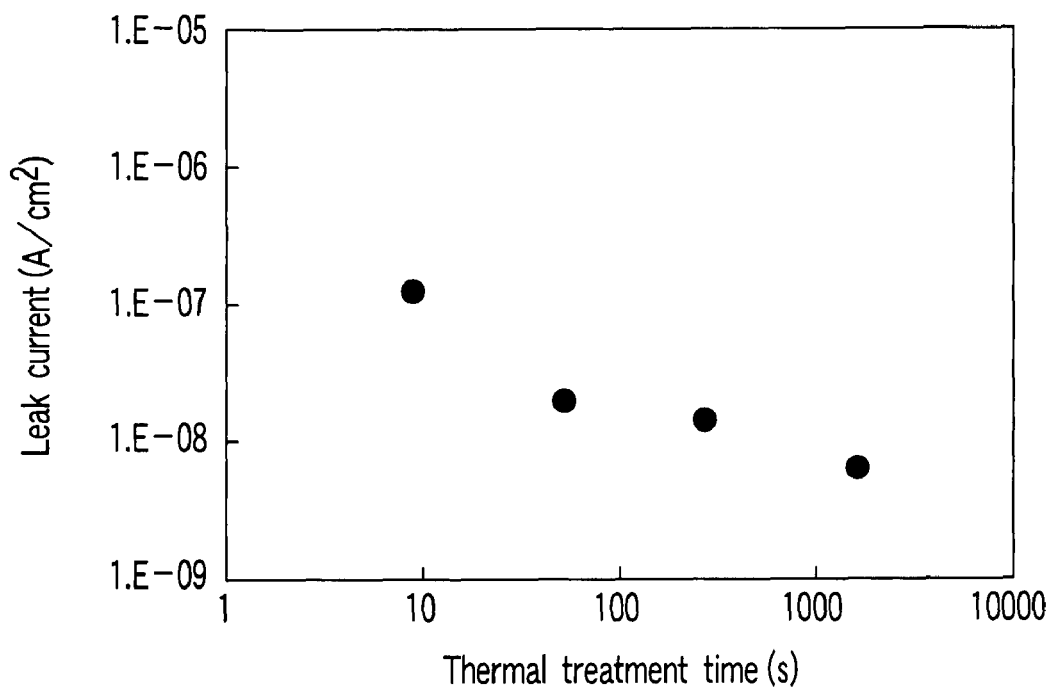
FIG. 18 is a diagram showing the relationship between thermal treatment time and a leak current in accordance with the fourth embodiment of the present invention.

FIG. 17 shows the relationship between a thermal treatment temperature in an oxygen gas atmosphere and a leak current of the inter-electrode insulating film observed with a 5-MV/cm electric field applied. FIG. 18 shows the relationship between thermal treatment time (thermal treatment temperature: 950° C.) and a leak current of the inter-electrode insulating film observed with a 5-MV/cm electric field applied. As shown in FIG. 17, the leak current tends to decrease with increasing thermal treatment temperature but to be saturated at 950° C. or higher. Further, FIG. 18 shows that the leak current decreases consistently with thermal treatment time. This indicates that as conditions for a reforming thermal treatment using oxygen, the thermal treatment temperature is desirably at least 900° C. and the thermal treatment time is desirably at least 30 seconds. Moreover, the leak current is more sharply reduced with a thermal treatment time of at least 30 minutes.

Like the second embodiment, the present embodiment forms a silicon oxide film (upper insulating film) 202 on the alumina film (lower insulating film) 201 and then executes thermal treatment in an atmosphere containing oxidizing gas (in the present embodiment, oxygen gas). However, as is the case with the first embodiment, after the formation of an alumina film (lower insulating film) 201, thermal treatment in an atmosphere containing oxidizing gas (in the present embodiment, oxygen gas) may be executed before the formation of a silicon oxide film (upper insulating film) 202. This method is particularly effective if the upper insulating film is composed of a material that cannot be easily permeated by oxidizing gas.

In the above first to fourth embodiments, the alumina film is used as the lower insulating film 201. However, in general, an insulating film containing oxygen and a metal element may be used. For example, a metal oxide film, a metal oxynitride film, or stack film including a metal oxide film and a metal oxynitride film may be used. If the lower insulating film 201 contains a transition metal (hafnium (Hf), zirconium (Zr), lanthanum (La), or the like) as a metal element, the film quality is markedly degraded when an upper insulating film 202 is formed. Thus, the film quality improving effect is enhanced.

In the above first to fourth embodiments, the silicon oxide film is used as the upper insulating film 202. However, in general, an insulating film may be used which is formed using film forming gas containing at least one of hydrogen and chlorine (in particular, an insulating film containing oxygen).

In the description of the above first to fourth embodiments, the nonvolatile memory has the inter-electrode insulating film 20 between the floating gate electrode (charge storage layer) 13 and the control gate electrode 21. However, the methods in accordance with the above first to fourth embodiments are applicable to a nonvolatile memory of what is called a MONOS structure having a charge block insulating film between a charge storage insulating layer and a control gate electrode.

Figure 19:
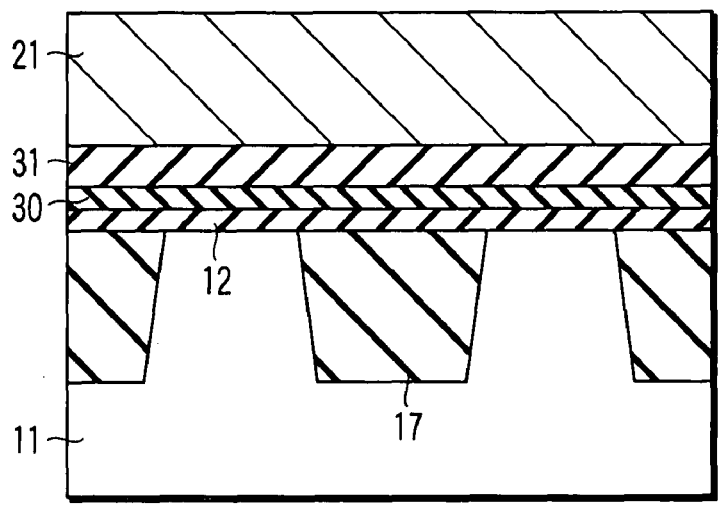
FIG. 19 is a sectional view schematically showing the configuration of a nonvolatile memory of a MONOS structure in accordance with an embodiment of the present invention.

FIG. 19 is a sectional view schematically showing the configuration of a nonvolatile memory of a MONOS structure. The basic configuration of this nonvolatile memory is similar to that in any of the first to fourth embodiments. Components corresponding to those shown in the first to fourth embodiments are denoted by the same reference numerals, and their detailed description is omitted.

In nonvolatile memory cells of the MONOS structure, the tunnel insulating film (first insulating film) 12, a charge storage layer (silicon nitride film) 30, a charge block insulating film (second insulating film) 31, and the control gate electrode (control electrode) 21 are sequentially stacked on the silicon substrate (semiconductor substrate) 11. It is possible to apply a method for forming an inter-electrode insulating film 20 shown in any of the first to fourth embodiments, to the charge block insulating film 31.

Thus, with the nonvolatile memory of the MONOS structure, effects similar to those shown in the first to fourth embodiments can be produced by applying a method similar to that shown in any of the first to fourth embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising a first insulating film formed on a semiconductor substrate, a charge storage layer formed on the first insulating film, a second insulating film formed on the charge storage layer, and a control electrode formed on the second insulating film, forming the second insulating film comprising:
    forming a lower insulating film containing oxygen and a metal element;
    forming an upper insulating film on the lower insulating film using film forming gas containing at least chlorine; and
    thermally treating the lower insulating film and the upper insulating film in an atmosphere containing oxidizing gas, so that a chlorine concentration in the lower insulating film is reduced, the thermal treating being performed under a condition that the oxidizing gas does not completely permeate the lower insulating film.

2. The method according to claim 1, wherein forming the second insulating film further comprises forming an insulating film containing oxygen, and
    the lower insulating film is formed on the insulating film containing oxygen.

3. The method according to claim 1, wherein forming the second insulating film further comprises forming an insulating film containing nitrogen, and
    the lower insulating film is formed on the insulating film containing nitrogen.

4. The method according to claim 1, wherein the oxidizing gas contains at least one of oxygen gas, ozone gas, steam, and an oxygen radical.

5. The method according to claim 1, wherein the lower insulating film has a higher dielectric constant than the upper insulating film.

6. The method according to claim 1, wherein the film forming gas further contains oxygen.

7. The method according to claim 1, wherein the upper insulating film is formed of a silicon oxide film.

8. The method according to claim 1, wherein the lower insulating film is formed of an aluminum oxide film.

9. The method according to claim 1, wherein the oxidizing gas contains ozone gas.

10. The method according to claim 1, wherein the oxidizing gas diffuses into the lower insulating film and the upper insulating film when thermally treating the lower insulating film and the upper insulating film.

* * * * *